(12) United States Patent
Halbmaier

(10) Patent No.: US 6,248,177 B1
(45) Date of Patent: Jun. 19, 2001

(54) METHOD OF CLEANING A WAFER CARRIER

(75) Inventor: David L. Halbmaier, Shorewood, MN (US)

(73) Assignee: Fluoroware, Inc., Chaska, MN (US)

( * ) Notice: Subject to any disclaimer, the term of this patent is extended or adjusted under 35 U.S.C. 154(b) by 0 days.

(21) Appl. No.: 09/227,702

(22) Filed: Jan. 8, 1999

Related U.S. Application Data

(60) Provisional application No. 60/072,458, filed on Jan. 9, 1998.

(51) Int. Cl.[7] ............... B08B 3/02; B08B 3/04; B08B 9/00; B08B 9/093
(52) U.S. Cl. ............... 134/2; 134/22.1; 134/22.12; 134/22.18; 134/25.1; 134/25.4; 134/33; 134/23; 134/24; 134/36; 134/170; 134/902
(58) Field of Search ............... 134/2, 22.1, 22.12, 134/22.18, 25.1, 25.4, 33, 36, 23, 24, 902, 170

(56) References Cited

U.S. PATENT DOCUMENTS

| | | |
|---|---|---|
| Re. 31,203 | 4/1983 | Jackson . |
| 1,661,602 | 3/1928 | Dary . |
| 3,092,120 | 6/1963 | Hilger et al. . |
| 4,133,340 | 1/1979 | Ballard . |
| 4,381,016 | 4/1983 | Douglas et al. . |
| 4,785,836 | 11/1988 | Yamamoto . |
| 5,286,302 | 2/1994 | Wickhamm, III . |
| 5,363,867 | 11/1994 | Kawano et al. . |
| 5,409,545 | 4/1995 | Levey et al. . |
| 5,522,410 | 6/1996 | Meilleur . |
| 5,562,113 | 10/1996 | Thompson . |
| 5,603,342 | 2/1997 | Shambaugh . |
| 5,616,208 | 4/1997 | Lee . |

Primary Examiner—Zeinab El-Arini
(74) Attorney, Agent, or Firm—Patterson, Thuente, Skaar & Christensen, P.A.

(57) ABSTRACT

A method of cleaning a wafer carrier utilizes two isolated fluidic circuits. The wafer carrier having an interior and an exterior. The carrier is sealingly attached to a cleaning apparatus having separate isolated areas, one isolated area including the interior and the other the exterior. Fluid of the first fluidic circuit is sprayed on the interior and fluid from the second circuit is sprayed on the exterior reducing cross contamination.

7 Claims, 12 Drawing Sheets

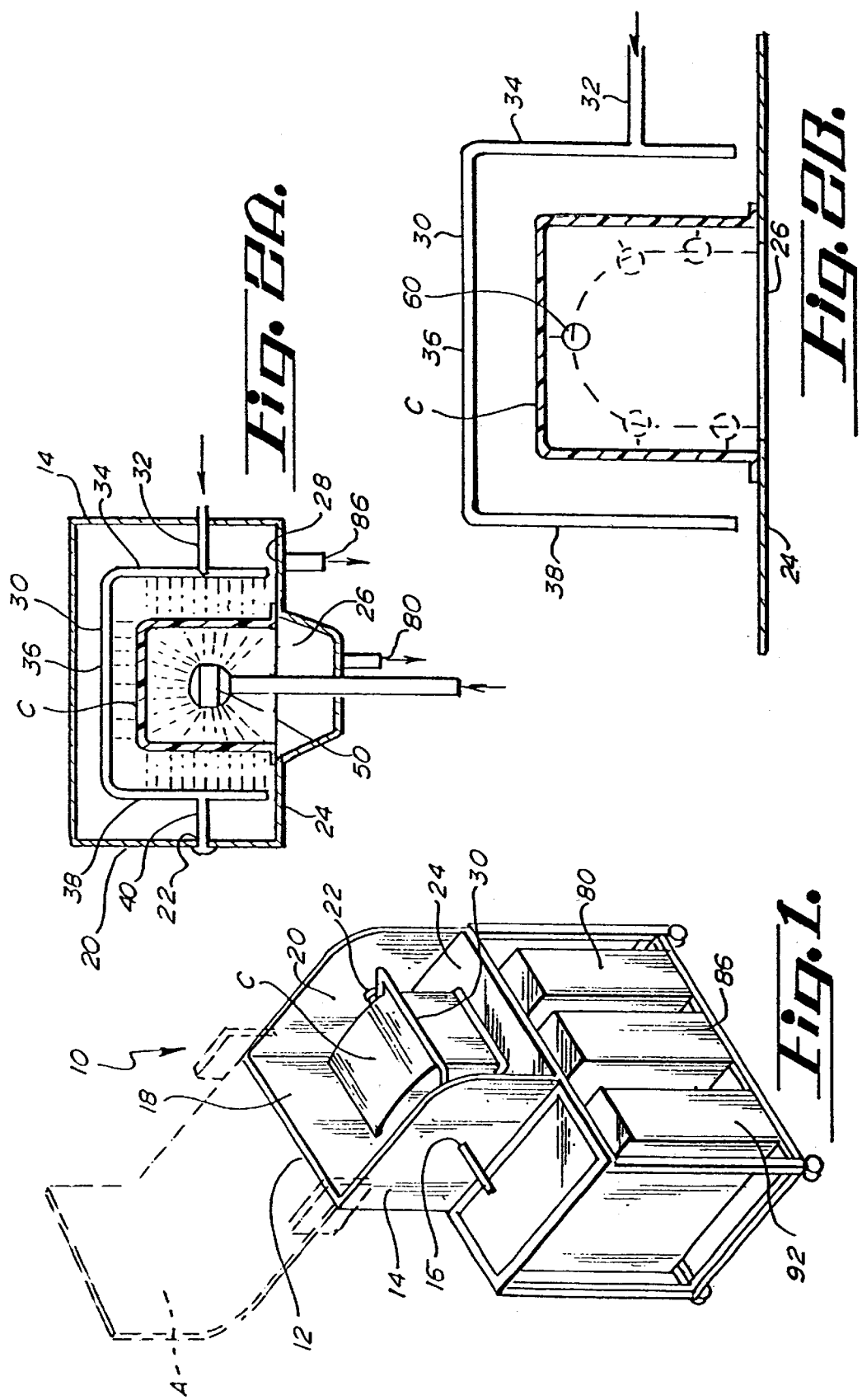

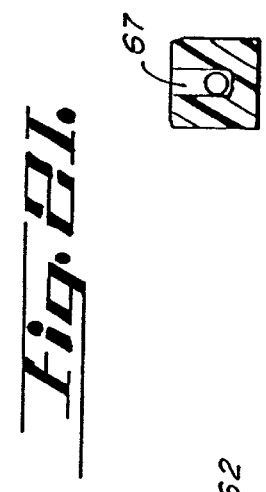
*Fig.2I.*
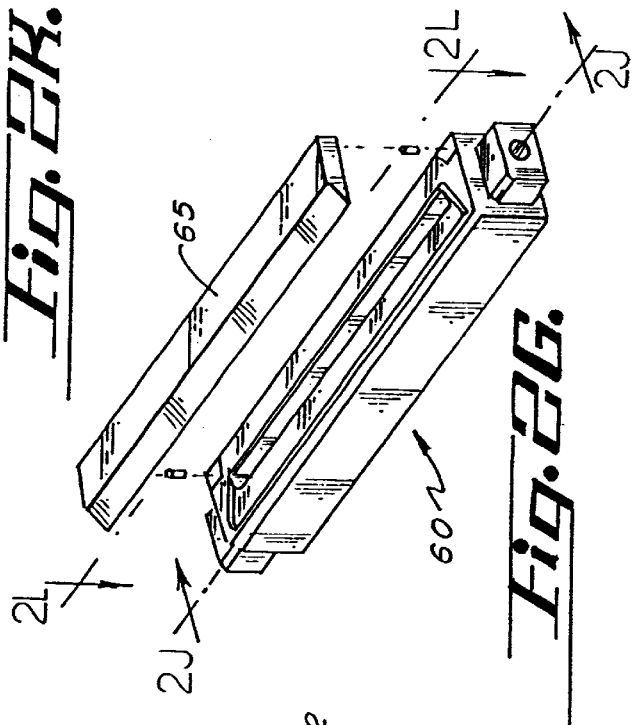
*Fig.2K.*
*Fig.2G.*
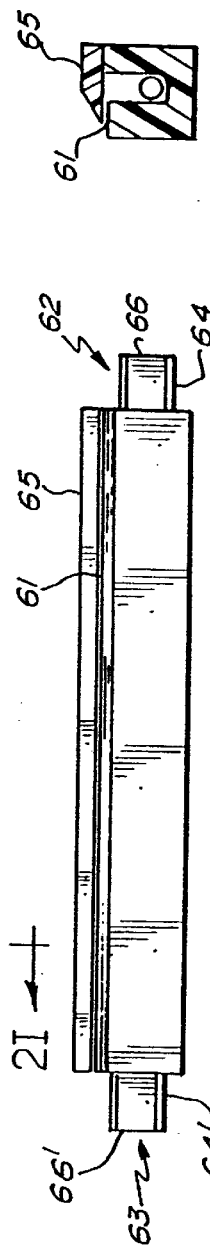
*Fig.2H.*
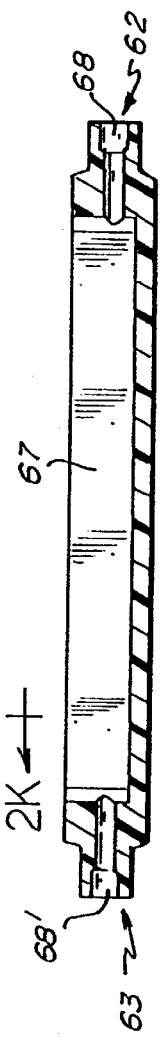
*Fig.2J.*
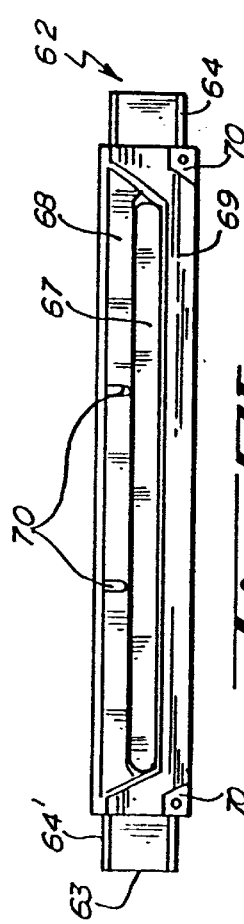
*Fig.2G.*

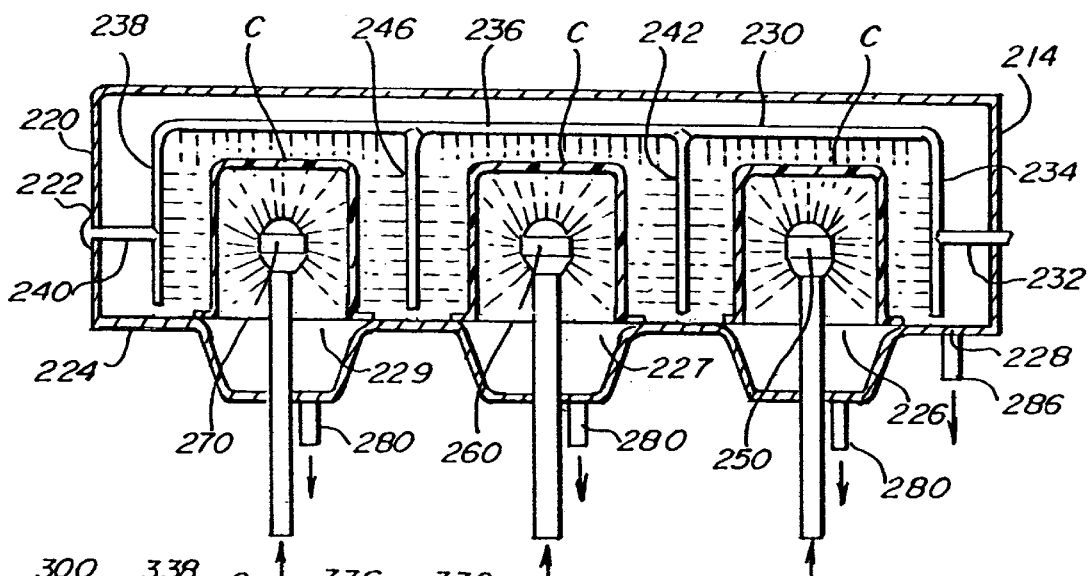
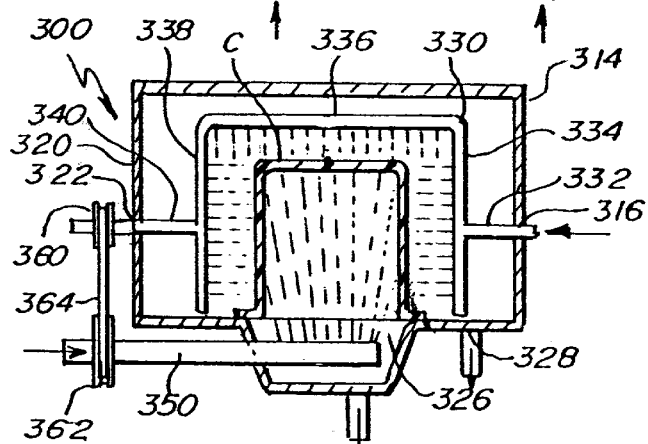
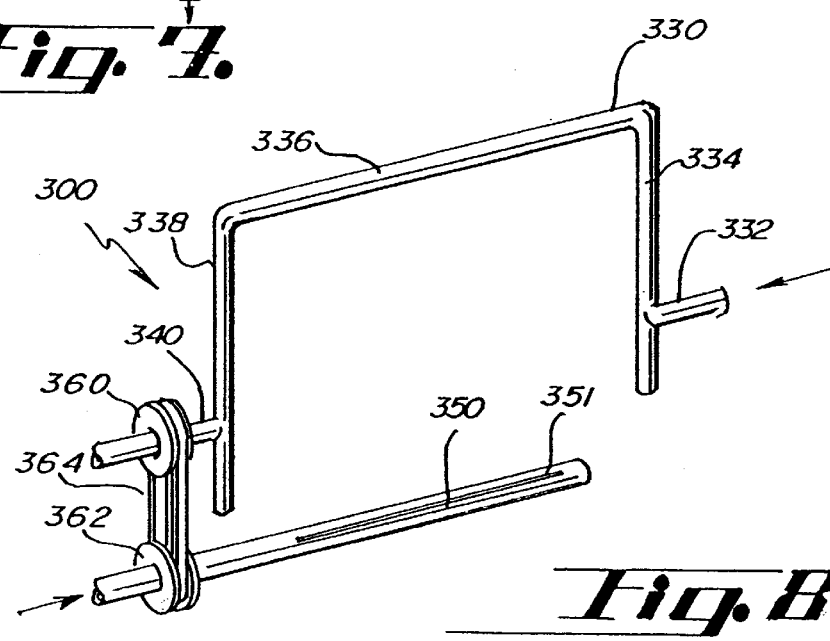

METHOD OF CLEANING A WAFER CARRIER

This is a utility application based on U.S. Provisional Patent Application No. 60/072,458, filed Jan. 9, 1998.

BACKGROUND OF THE INVENTION

This invention relates to carriers used in the semiconductor fabrication industry, and in particular to an apparatus and method of cleaning said carriers.

The process of forming semi-conductor wafers or other delicate electronic components into useful articles require high levels of precision and cleanliness. As these article become increasingly complex and miniaturized, contamination concerns grow. The problems of airborne contamination can be significantly reduced by providing controlled fabrication environments known as clean rooms. While clean rooms effectively remove airborne contaminants found in ambient air, it is often not possible or advisable to completely process wafers in the same clean room environment. Moreover, not all contamination and contaminants are eliminated. For that and other reasons, semi-conductor wafers are transported, stored, and fabricated in bulk with the assistance of protective carriers or pods. These carriers generally include closures which enable the carriers or pods to maintain their own micro-environment. This further reduces the potential from some airborne contaminants.

Contamination and contaminants can generated by other mechanisms. For example, particulates can be generated mechanically by wafers as they are inserted into and removed from wafer carriers, and as doors are attached and removed from the carriers, or they can be generated chemically in reaction to different processing fluids. Contamination can also be the result of out-gassing on the carrier itself, biological in nature due to human activity, or even the result of improper or incomplete washing of the carrier. Contamination can also occur on the exterior of a carrier as the carrier is transported from station to station during processing.

These contaminants and contamination can be reduced by periodically washing and/or cleaning the carriers or pods. Typically, a carrier is cleaned of contaminants and contamination by placing the carrier in a cleaning apparatus which subjects the exterior and interior surfaces to cleaning fluids. Often, the fluids used to clean the exterior surfaces are different from the fluids used to clean the interior surfaces. The expended fluid is usually collected in a common receptacle and discarded. Or a cleaning apparatus will utilize the same cleaning fluids for the exterior and interior surfaces. This allows the expended fluid to be recycled.

There are several problems associated with such carrier cleaners. They use large amounts of material because they do not provide for recycling. With those which do recycle, they are unable to tailor the fluids to the specialized needs of the exterior and interior surface. And they do not provide for door or closure cleaning.

There is a need for a wafer carrier cleaner with minimal cross contamination between exterior and interior surface cleaning fluids, a wafer carrier cleaner which conserves valuable resources, a wafer carrier cleaner with a door cleaning capability, and a wafer carrier cleaner which can operate in a moderately controlled environment.

SUMMARY OF THE INVENTION

The present invention is directed to a semi-conductor wafer carrier cleaner, with the term wafer carrier to be construed as a container which is designed or adapted to hold semi-conductor wafers used in the semiconductor industry. Wafer carrier includes, but is not limited to: conventional H-bar wafer carriers; Front Opening Unified Pods (FOUP); Standard Mechanical Interface Pods (SMIF), wafer carrier door holding fixtures, and other carriers used in the micro-electronic industry for storing, transporting, fabricating, and generally holding small electronic components such as semi-conductor chips, ferrite heads, magnetic resonant read heads, thin film heads, bare dies, bump dies, substrates, optical devices, laser diodes, preforms, and miscellaneous mechanical devices.

The wafer carrier cleaner of the present invention includes dual or parallel fluidic circuits are dedicated to, and designed for applying fluids to different predetermined surfaces of a wafer carrier. That is, the wafer carrier cleaner has separate fluidic circuits for applying fluids from first and second isolated areas of the apparatus to the interior and exterior surfaces of a wafer carrier, respectively; the terms fluid and fluidic encompassing states of matter which are gaseous, liquid, or combinations thereof; i.e., flowable.

Generally, one fluidic circuit supplies fluid to the exterior of a wafer carrier while another fluidic circuit supplies fluid to the interior of a wafer carrier.

Specifically, fluids are used to periodically clean, rinse, dry or otherwise prepare (eg., decontaminate) the interior and exterior surfaces of a wafer carrier. Preferably, the fluids are applied through dedicated sprayers which are movably connected to the fluidic circuits. The fluidic circuits include the necessary and appropriate drains, valves, filters and pumps for the interiorally and exteriorally applied fluids, respectively. The valves enable the fluids in the fluidic circuits to be recycled, combined, purged, or recharged as desired or needed.

A wafer carrier cleaner having the features of the present invention comprises a base upon which a wafer carrier (sans door) or a door holding fixture may be sealingly placed and secured. Broadly speaking, the act of placing a wafer carrier component on the base of the cleaning apparatus (which may include sidewalls and a rear wall to form a fluid tight chamber) creates two isolation areas, with the first isolation area including the interior space defined by the wafer carrier component and the base, and the second isolation area defined as that space which is external to the wafer carrier component. The base has a first aperture and a second aperture which permit access and movement of material into these first and second isolation areas, respectively. The first aperture, over which a wafer carrier is positioned, is configured to permit access to the interior thereof, while the second aperture is located outside of the exterior surface of a wafer carrier. In use, a wafer carrier is placed upon the base such that the access aperture of the carrier is coincident with the first aperture in the base. An optional closure for the wafer carrier cleaner may then be closed. A first or exterior sprayer (connected to a first fluidic circuit) and a second or interior sprayer (connected to a second fluidic circuit) then clean the exterior and interior surface of the carrier, preferably simultaneously.

The exterior sprayer applies relatively clean fluid to the exterior surfaces of a carrier as it rotates thereabout in an oscillating manner. As the expended (used) fluid falls away from the exterior surfaces, it is directed through the second aperture and into the first fluidic circuit. The interior sprayer, on the other hand, applies relatively clean fluid to the interior surface of a carrier by moving the sprayer vertically in a reciprocal manner with respect to the carrier or fixture. As the expended (used) fluid falls away from the interior surfaces, it is directed through the first aperture and into the second fluidic circuit.

Although the exterior sprayer is depicted generally as a tube with a plurality of spaced apertures, the tube configured and arranged to move with respect to the wafer carrier, other forms are envisioned. The exterior sprayer may incorporate ultra and/or mega sonic transducers which facilitate surface preparation. Similarly, the interior sprayer may incorporate ultra and/or mega sonic transducers which facilitate surface preparation.

Alternatively, the fluids may be applied directly to the exterior and interior surfaces by submersion in appropriately designed wet benches. An advantage of the submersion technique is that drying time is substantially reduced.

In an alternative embodiment, multiples of wafer carriers may be prepared concurrently. In the particular case of two wafer carriers, a fixture has been provided to enable the entire wafer carrier and attendant door to be prepared at the same time.

Note that door removal and the placement of the wafer carrier without the door on the base may be accomplished manually or by robotic and/or automated means.

A feature of the preferred embodiments of the invention is that fluid used to prepare and/or clean the exterior surface of a wafer carrier is isolated from the fluid used to prepare and/or clean the interior surface of a wafer carrier, thereby reducing cross contamination.

Another feature of the preferred invention is that the exterior and interior preparation fluids are contained within the separate fluidic circuits.

Another feature of the preferred embodiment is that the useful working life of fluids is extended and wastage thereof is reduced.

Another feature of the preferred invention is that the dedicated fluidic circuits simplify the delivery of different combinations and types of fluids used to accomplish different processing steps.

Yet another feature of the preferred invention is that the fluid circuits may by re-charged, purged, admixed, or otherwise manipulated by the use of appropriate fluidic controls.

Still another feature of the preferred invention is that surface preparation of exterior and interior surfaces of wafer carriers is accomplished by dedicated sprayers connected to the fluidic circuits.

Yet another feature of the preferred invention is that the a wafer carrier and a door, or multiple wafer carriers and doors may be prepared at the same time.

Another feature of the preferred embodiment is to simplify cleaning of a plurality of doors by providing a multiple door holding fixture.

Additional objects, advantages, and features of the invention will be set forth in part in the description which follows, and in part will become apparent to those skilled in the art upon examination of the following or may be learned by practice of the invention. The objects and advantages of the invention may be realized and attained by means of the instrumentalities and combination s particularly pointed out in the appended claims.

BRIEF DESCRIPTION OF THE DRAWINGS

FIG. 1 is a perspective view of the invention;

FIG. 2A is a cross-sectional plan front of the invention;

FIG. 2B is a cross sectional plan front of another embodiment of the invention;

FIG. 2G is an exploded perspective view of the fluid applicator of 2F;

FIG. 2H is a front plan view of the fluid applicator of FIG. 2G;

FIG. 2I is a cross sectional view end of the FIG. 2H taken along cut line 2I—2I;

FIG. 2J is a front cross sectional view of FIG. 2G taken along line 2J—2J;

FIG. 2K is a cross sectional end view of FIG. 2J taken along line 2K—2K;

FIG. 2L is a partial top view of the fluid applicator of FIG. 2G taken along line 2L—2L;

FIG. 6 is a cross-sectional front view of the third embodiment of the invention;

FIG. 7 is a cross-sectional front view of a synchronized spray mechanism;

FIG. 8 is a perspective view of the synchronized spray mechanism;

Figure 2C:
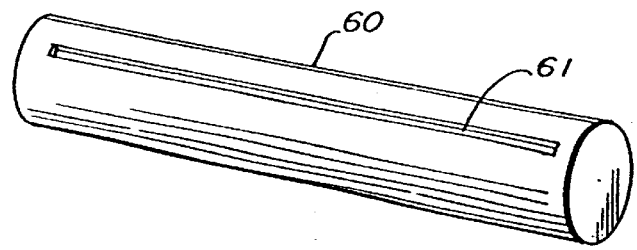
FIG. 2C is a perspective view of the interior sprayer of FIG. 2B.

It is understood that the above figures are for illustrative purposes only and are not meant to limit the scope of the claimed invention.

DETAILED DESCRIPTION

Referring to FIG. 1, the wafer carrier cleaner of the present invention is identified generally as 10. For purposes of illustration, a wafer carrier C is depicted as it would appear during the cleaning process.

The wafer carrier cleaner 10 comprises a chamber 12 which has a first sidewall 14, a rear wall 18, a second sidewall 20 and a base 24. The first sidewall 14 has an aperture 16 which is sized to receive a portion of a first or exterior sprayer 30, and the second sidewall 20 has a support/aperture 22 which is sized to receive another portion of the exterior sprayer 30. The base includes a first aperture and a second aperture (not shown in this view) which will be described later. Note that the exterior sprayer 30 is configured such that it circumscribes the exterior of a wafer carrier. Chamber 12 may be provided with a cover or closure A (as shown in dashed lines) which, in use, encloses the chamber. The cover A may be hingedly attached to the chamber and provided with a gasket so that the chamber may be effectively sealed. Additionally, the cover may be provided with an assist and a locking device to facilitate handling thereof.

Referring to FIG. 2A, exterior sprayer 30 is generally u-shaped having a first leg 34, a span 36, and a second leg 38. The first leg 34, the span 36 and the second leg 38 are provided with at least one aperture (not shown) which directs the flow of cleaning fluid towards an exterior surface of a wafer carrier component C. A first extension 32 is attached to first leg 34 and a second extension 40 is attached to second leg 38. The extensions 32, 40 cooperate with aperture 16 and support/aperture 22 in sidewalls 14, 16, respectively, to enable sprayer 30 to rotate in an oscillatory manner about a wafer carrier C. Although the exterior or first sprayer is depicted as being generally u-shaped, it is understood that sprayers of different configurations can be used without departing from the spirit and scope of the invention. For example, the external sprayer could be c-shaped and mounted for rotation about a vertical axis. Or, the exterior sprayer could be a generally closed loop through which a wafer carrier may move. Or the sprayer could be fixed. An interior or second sprayer 50 is positioned such that it projects through an aperture 26 in base 24. The interior sprayer 50 is provided with at least one aperture (not shown in this view) which directs the flow of cleaning fluid towards the interior surface of a wafer carrier. Although the sprayer depicted projects through aperture 26, it is within the scope of the invention to provide a sprayer which lies below the plane of base 24. Cleaning fluids from different sources may be supplied to the interior and exterior sprayers as indicated by directional arrows. This fluid separation is maintained throughout the cleaning operation and, to that end, the base 24 is provided with as apertures 26, 28 wherein the used or gray fluid of interior sprayer 50 is directed through first aperture 26 and the used or gray fluid of exterior sprayer 30 is directed through second aperture 28. The separated used fluids may then be routed to first and second receptacles 80, 86 for processing and/or recycling if desired. Processing may include, but is not limited to: re-spraying; filtering; reheating; purging; deionizing; admixing; cooling; and, diluting. Controls for the wafer carrier cleaner may be contained within a third receptacle 92, as shown in FIG. 1, to facilitate automation.

Referring to FIG. 2B, the exterior sprayer 30 is essentially the same as discussed above and will not be repeated here. The interior sprayer 60 differs from interior sprayer 50 in that it utilizes a slot instead of a plurality of apertures to deliver cleaning fluid to a surface. This type of aperture is most useful for delivering gaseous fluids, and with it an area may be "wiped" dry. In operation, interior sprayer 60 starts at the top interior surface of a wafer carrier and moves along either side of the carrier. To that end, sprayer 60 may be provided with a track (shown in dashed lines) which directs the motion of sprayer 60 as desired. Alternatively, sprayer 60 may be rotatably mounted along its longitudinal axis to enable an interior of a wafer carrier to be cleaned/wiped.

Referring to FIG. 2C, the interior sprayer 60 includes a slot 61 which is used to deliver cleaning fluid to a surface. As a liquid exits slot 61 it is in the form of a sheet.

Figure 2D:
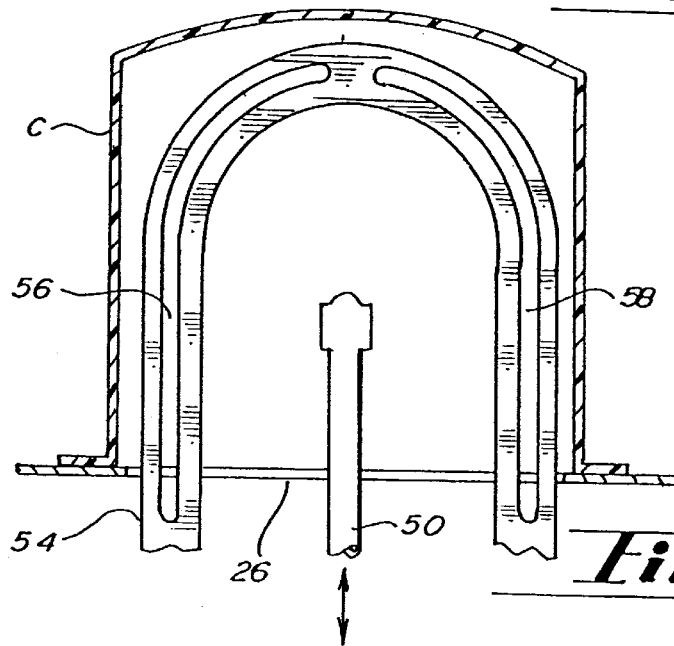
FIG. 2D is a partial side view of an interior sprayer arrangement.

Referring to FIG. 2D, the interior sprayers of 2A, 2B, and 2C are combined. The exterior sprayer is omitted for clarity. In this figure, there is an interior sprayer 50 which is movable upwardly and downwardly to enable it to spray the interior of a wafer carrier or pod. There are also two additional sprayers (not shown) whose travel is limited by grooves in parallel tracks which slidingly receive projections which extend from both ends of each sprayer (see FIGS. 2E and 2F).

Figure 2E:
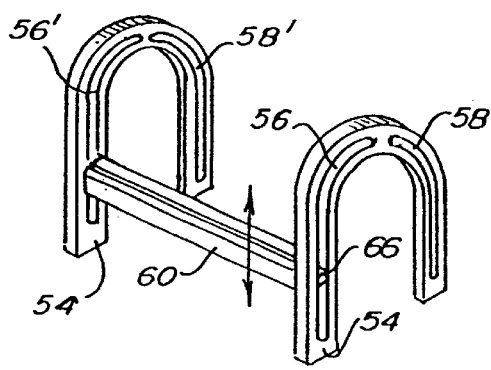
FIG. 2E is a partial exploded perspective view of FIG. 2D.

Referring to FIG. 2E, the tracks 54, 54' are generally in the shape of an inverted "U" and are identically shaped. The tracks include grooves 56, 56' 58, 58' which cooperate with both complimentary shaped protrusions which extend from the ends of the sprayers along their longitudinal axes. Note that only a single longitudinal sprayer is depicted in the figure.

Figure 2F:
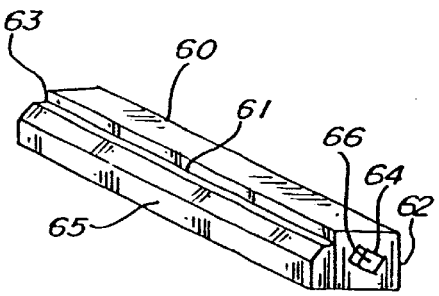
FIG. 2F is a perspective view of a fluid applicator of FIG. 2E.

Referring to FIG. 2F, the longitudinal sprayer 60 includes a slot 61 which extends along the length of the sprayer 60 and terminates at ends 62 and 63 (not shown). The sprayer 60 is provided with protrusions 64, 64' (not shown) which extend from the ends 62, 63 and which cooperate with grooves 56, 56' in tracks 54, 54', so that as the sprayer moves relative to the tracks 54, 54' the sprayer sweeps the interior of a wafer carrier or pod. The longitudinal sprayer 60 may also be provided with conventionally shaped sprayers which are located at and which extend from the protrusions. The conventional sprayers are used to spray areas which are orthogonal to the longitudinal axes of the sprayers.

Referring to FIGS. 2G, 2H, 2I, 2J, 2K, and 2L, the longitudinal sprayer comprises a generally rectangular block 60 having opposite ends 62, 63, and a longitudinal channel 67. The longitudinal channel is covered by a slat 65. When the slat 65 is placed over the channel 67 of block 60, a longitudinal slot 61 between 0.000" and 0.25" wide is formed. The preferred width of the slot 61 is around 0.004". This distance is maintained by lands 70. The slat 65 is preferably adhesively attached to block 60 along a longitudinal land 69. Once the slat 65 is attached, it forms slot 61, and it is through this slot 61 that the cleaning and drying fluids are applied. At either end of block 60, are optional holes 68, 68' into which conventional sprayers may be attached.

Regarding FIGS. 2D through 2L, the preferred arrangement is to have liquid fluids applied by interior sprayer 50, and gaseous fluids applied by the longitudinal sprayers. Additionally, it is understood that the spraying movements will be from the top to the bottom. This is done to take advantage of the force of gravity and to reduce the chances that contaminated fluids fall or splash back onto clean surfaces.

It is understood that the tracks 54, 54' could be used in a similar arrangement to clean the exterior of a wafer carrier or pod.

Figure 3:
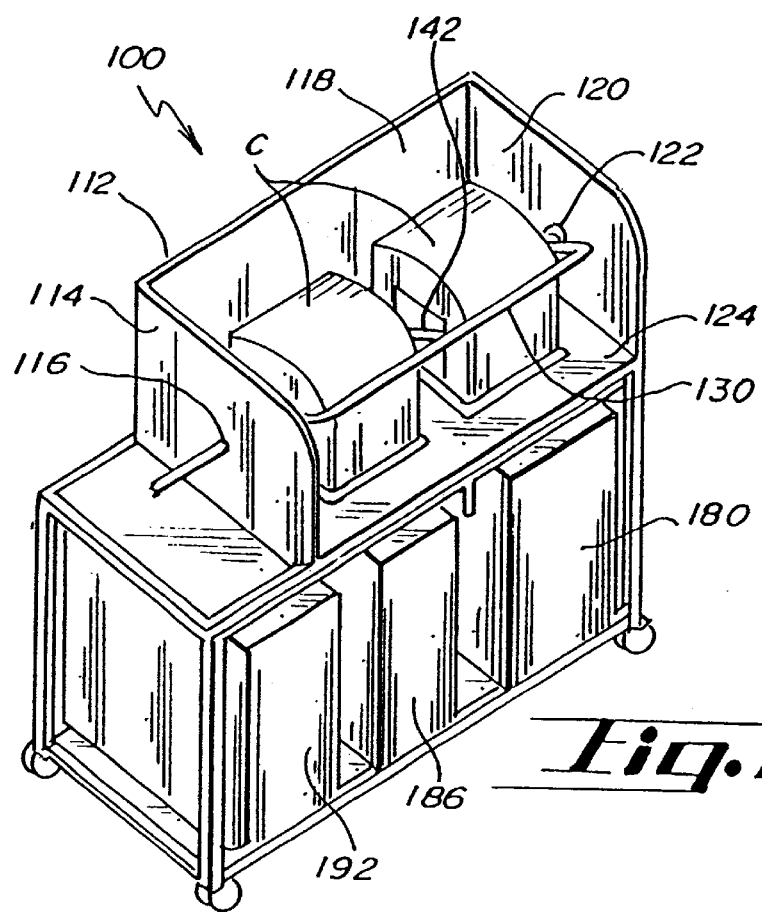
FIG. 3 is a perspective view of a second embodiment of the invention.

Referring to FIG. 3, the wafer carrier cleaner 100 comprises a chamber 112 which has a first sidewall 114, a rear wall 118, a second sidewall 120 and a base 124. The first sidewall 114 has an aperture 116 which is sized to receive a portion of an exterior sprayer 130, and the second sidewall 120 has a support/aperture 122 which is sized to receive another portion of the exterior sprayer 130. The chamber 112 is configured to allow cleaning of two wafer carriers C. The base 124 includes a first aperture, a second aperture and a third aperture (not shown) which will be described later. Note that the exterior sprayer 130 is configured such that it circumscribes the exteriors of two wafer carriers C.

Figure 4:
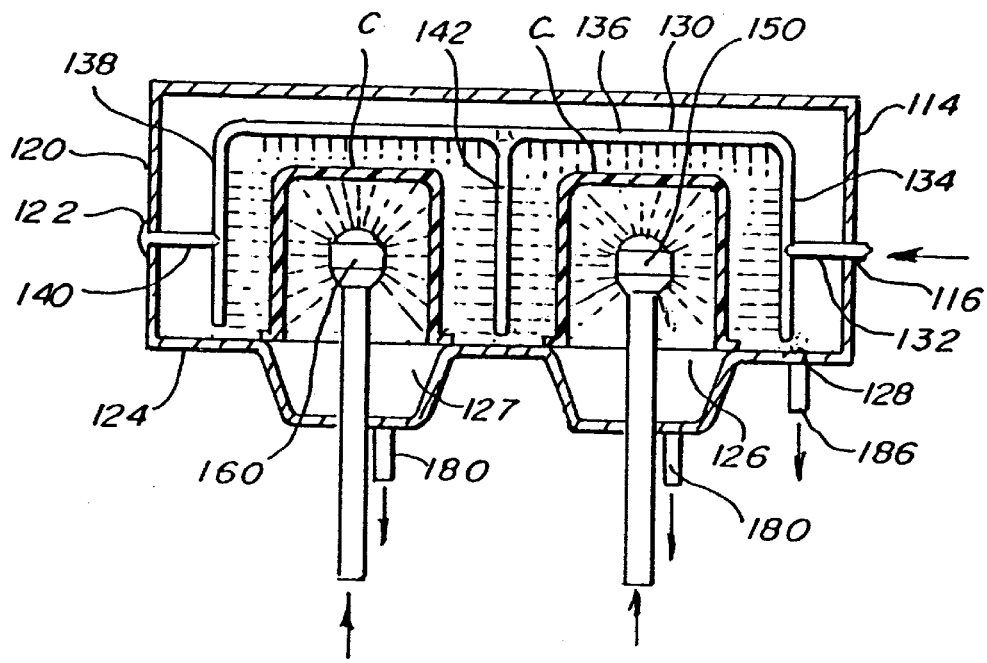
FIG. 4 is a cross-sectional front view of the second embodiment of the invention.

Referring to FIG. 4, exterior sprayer 130 is generally M-shaped having a first leg 134, a span 136, a second leg 138, and a middle leg 142. The first leg 134, the span 136, the middle leg and the second leg 138 are provided with apertures (not shown 141) which direct the flow of cleaning fluid towards exterior surfaces of wafer carriers C. A first extension 132 is attached to first leg 134 and a second extension 140 is attached to second leg 138. The extensions 132, 140 cooperate with aperture 116 and support/aperture 122 in sidewalls 114, 120, respectively, to enable sprayer to rotate in an oscillatory manner about two wafer carriers C. Interior sprayers 150 and 160 are positioned such that they project through an apertures 126 and 127 in base 124. The interior sprayers 150, 160 are provided with at least one aperture (not shown) which directs the flow of cleaning fluid towards the interior surfaces of wafer carriers C. Although the sprayers depicted project through apertures 126 and 127, it is within the scope of the invention to provide a sprayer or sprayers which lie below the plane of base 124. Cleaning fluids from different sources are supplied to the interior and exterior sprayers as indicated by directional arrows. As previously described, the fluid separation is maintained throughout the cleaning operation.

Figure 5A:
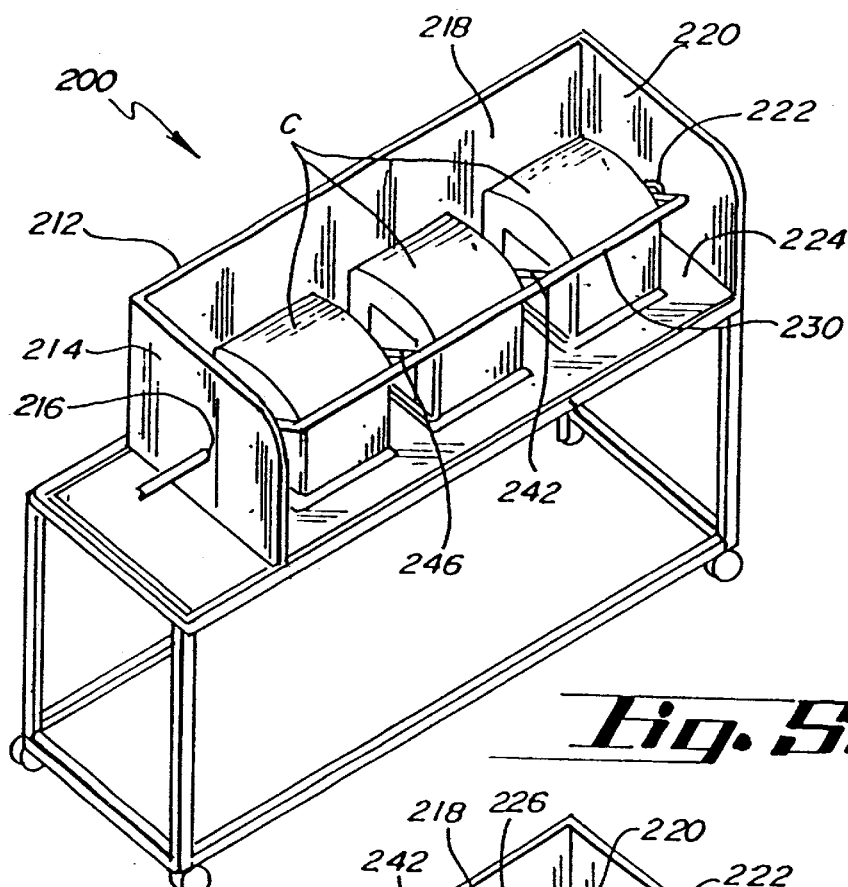
FIG. 5A is a perspective view of a third embodiment of the invention.
Figure 5B:
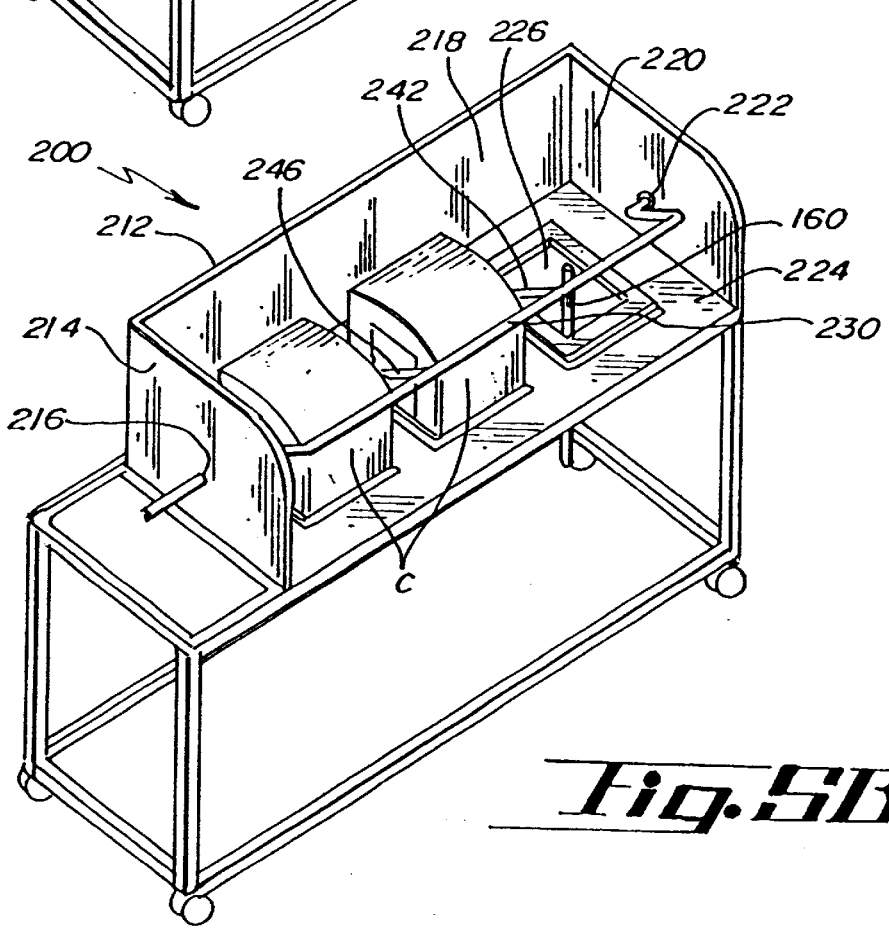
FIG. 5B is a perspective view of a third embodiment of the invention.

Referring to FIGS. 5A and 5B, the wafer carrier cleaner 200 comprises a chamber 212 which has a first sidewall 214, a rear wall 218, a second sidewall 220 and a base 224. The first sidewall 214 has an aperture 216 which is sized to receive a portion of an exterior sprayer 230, and the second sidewall 220 has a support/aperture 222 which is sized to receive another portion of the exterior sprayer 230. The base includes a first aperture 226, a second aperture, a third aperture, and a fourth aperture (not shown) which will be described later. Note that the exterior sprayer 230 is configured such that it circumscribes the exteriors of a plurality of wafer carriers C. In FIG. 5B, one of the wafer carriers has been removed to show aperture 226 and interior sprayer 150 relative thereto.

Referring to FIG. 6, exterior sprayer 230 is generally comb-shaped having a first leg 234, a span 236, a second leg 238, a third leg 242 and a fourth leg 246. The first leg 234, the span 236, the second leg 238, the third leg 242, and the fourth leg 246 are provided with apertures (not shown) which direct the flow of cleaning fluid towards exterior surfaces of wafer carriers C. A first extension 232 is attached to first leg 234 and a second extension 240 is attached to second leg 238. The extensions 232, 240 cooperate with aperture 216 and support/aperture 222 in sidewalls 214, 216, respectively, to enable sprayer to rotate in an oscillatory manner about wafer carriers C. An interior sprayer 250 is positioned such that it projects through an aperture 226 in base 224. The interior sprayers 250, 260, and 270 are provided with at least one aperture (not shown) which direct the flow of cleaning fluid towards the interior surfaces of a plurality of wafer carriers C. Although the sprayers depicted projects through aperture 226, 227, and 229, it is within the scope of the invention to provide sprayers which lie below the plane of base 224. Cleaning fluids from different sources are supplied to the interior and exterior sprayers as indicated by directional arrows. This fluid separation is maintained throughout the cleaning operation and, to that end, the base 224 is provided with four apertures 226, 228, 227, and 229, wherein the used or gray fluid of interior sprayers 250, 260 and 270 is directed through apertures 226, 227, 229 and the used or gray fluid of exterior sprayer 230 is directed through second aperture 228. The separated used fluids may then be routed to first and second receptacles for processing and/or recycling if desired.

Referring to FIGS. 7 and 8, the exterior 330 and interior sprayers 350 are connected to each other to permit synchronized movement. Exterior sprayer 330 is generally u-shaped having a first leg 334 a span 336 and a second leg 338. The first leg 334, the span 336 and the second leg 338 are provided with at least one aperture (not shown 341) which direct the flow of cleaning fluid towards an exterior surface of a wafer carrier C. A first extension 332 is attached to first leg 334 and a second extension 340 is attached to second leg 338. The extensions 332, 340 cooperate with aperture 316 and support/aperture 322 in sidewalls 314, 320, respectively, to enable sprayer to rotate in an oscillatory manner about a wafer carrier C. An interior sprayer 350 is positioned such that it projects fluid through an aperture 326 in base 324. The interior sprayer 350 is provided with at least one aperture (not shown) which directs the flow of cleaning fluid towards the interior surface of a wafer carrier.

Although the interior and exterior sprayers are depicted for cleaning one wafer carrier, it is understood that the arrangement may be used for multiple wafer carrier cleaning chambers. The exterior and interior sprayer aperture may be conventionally configured or may be configured as one longitudinal slot, as in an air knife, for example. The sprayers may be provided with a plurality of slots or a combination of slots and apertures which produce a desired cleaning pattern. Synchronization of the interior and exterior sprayers 350, 330 is accomplished by a pair of pulleys 360, 362 attached to the exterior and interior sprayers, respectively, and a belt 364 attached therebetween. As the exterior sprayer moves, so does the interior sprayer. Different relative rotational speeds can be achieved by used differently sized pulleys. Counter rotation can be achieved by providing a twist to the pulley. Although belts and pulleys are depicted, it is within the scope of the invention to utilize other mechanisms for synchronous motion without departing from the scope of the invention.

Referring to FIGS. 9–13, chambers 400, 500 depict cleaning of a plurality of wafer carriers and a plurality of wafer carrier doors which are removably attached to a door cleaning adaptor. The wafer carriers and doors are each wafer carrier components and each has an interior and exterior surface.

Figure 10B:
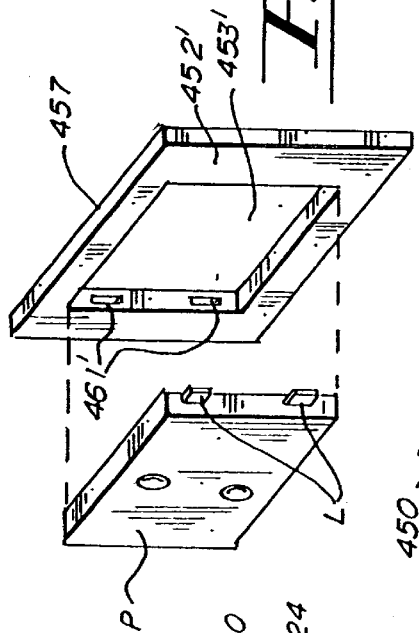
FIG. 10B is a perspective view of a door adaptor.
Figure 10A:
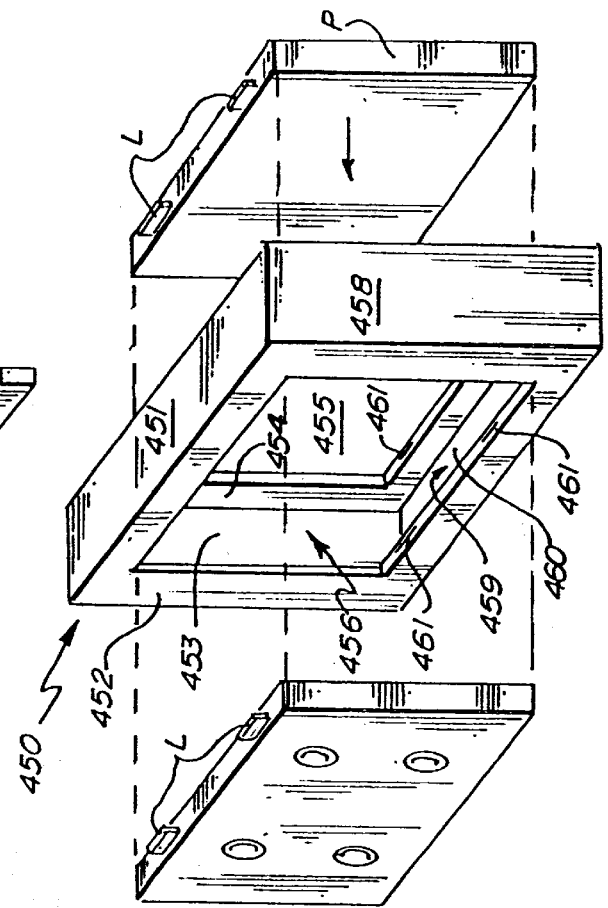
FIG. 10A is perspective view of the center section of the fourth embodiment.
Figure 9:
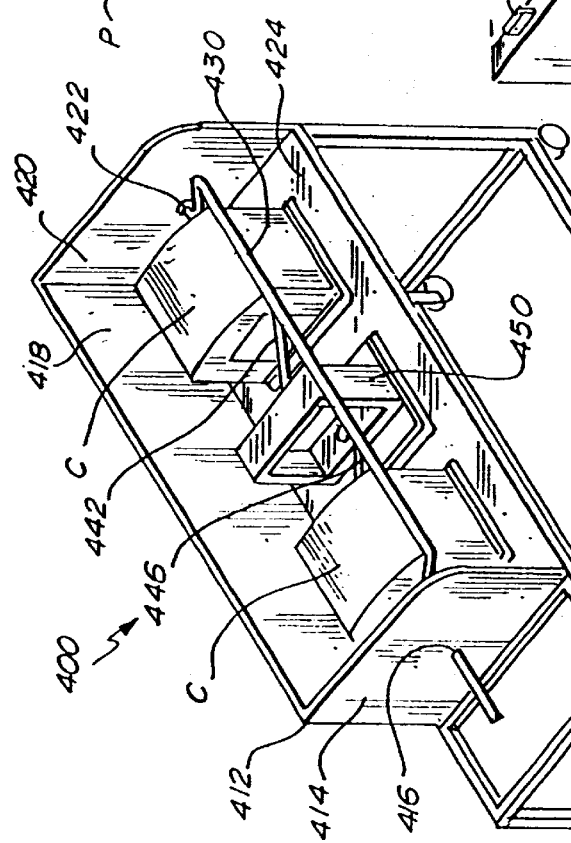
FIG. 9 is a perspective view of a fourth embodiment of the invention.
Figure 11:
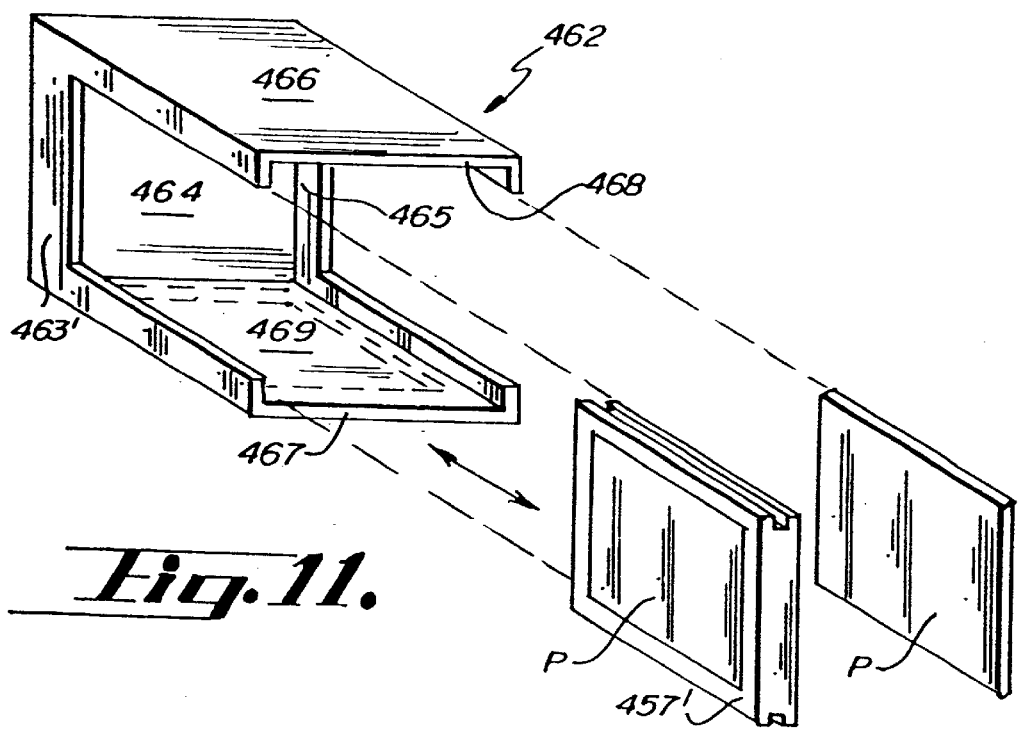
FIG. 11 is an alternate embodiment of the center section of the fourth embodiment.

More specifically, FIGS. 9–11 depict a chamber which is capable of cleaning two wafer carriers and two doors which are parallel to each other, while FIGS. 12–13 depict a chamber which is capable of cleaning two wafer carriers and two doors which are angled with respect to each other. Referring to FIG. 9, wafer carrier cleaner 400 comprises a chamber 412 which has a first sidewall 414, a rear wall 418, a second sidewall 420 and a base 424. The first sidewall 414 has an aperture 416 which is sized to receive a portion of an exterior sprayer 430, and the second sidewall 420 has a support/aperture 422 which is sized to receive another portion of the exterior sprayer 430. Note that the exterior sprayer 430 is configured such that it circumscribes the exteriors of a plurality of wafer carriers and a door cleaning adaptor or fixtures 450.

Referring to FIG. 10A, the door cleaning adaptor 450 includes a frame which is generally rectangular in shape and includes a first and second sides 452, 454 which include apertures 453, 455 which are sized to releasably retain wafer carrier doors P. The doors are provided with latching tips L which can be extended and withdrawn relative to the door to enable the door to be releasably retained to the adaptor. The adaptor 450 includes a top wall 451, edge walls 456, 458 and bottom 459 with an aperture 460. Aperture 460 is provided with slots 461 which cooperate with tips L to releasably retain the doors to the adaptor 450. Aperture 460 is sized to allow interior cleaning fluid in the space defined by the cleaning adaptor and wafer carrier doors.

Referring to FIG. 10B, the door cleaning adaptor 450 includes a jig or fixture 457 onto which a door P is removably attached, and the jig or fixture 457 is removably attached to the door cleaning adaptor 450. A door P is attached to jig 457 by pins L which cooperate with slots 461'. The jig or fixture 457 may be attached to adaptor 450 in a similar manner (not shown). The jig or fixture 457 may also be used to releasably retain a wafer carrier to the base of a cleaning chamber in lieu of a direct connection, if desired (not shown). The jig or fixture 457 may be used in conjunction with the adapters depicted in FIGS. 11 and 13 if desired.

An alternative door cleaning adaptor is depicted in FIG. 11, in which the adaptor 462 includes a frame which is generally rectangular in shape and includes first and second u-shaped channels 463, 465 which are adapted to receive a wafer carrier door P, or alternatively, a door P which has been attached to a jig or fixture 457'. The adaptor includes an edge walls 464, 466, and 469. Edge wall 469 may include an aperture (shown in dashed lines) through which an interior sprayer or interior cleaning fluid may pass. The adaptor 462 may be provided with and a hinged edge wall which creates an enclosure, or the adaptor itself may be hingedly attached to the base at edge 467 (not shown). In either case, an interior space is created, and it is understood that this space is then cleaned in the same manner as the wafer carriers, or pods.

Figure 12A:
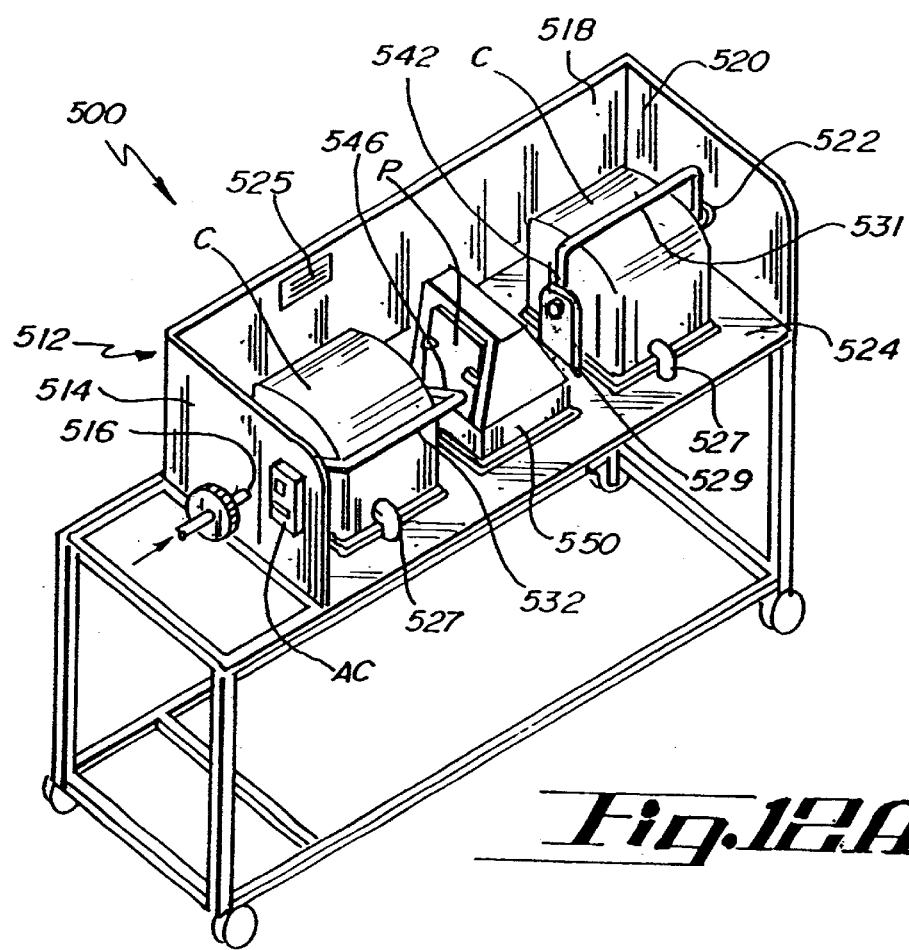
FIG. 12A is a perspective view of another embodiment of the center section of the fourth embodiment.
Figure 12B:
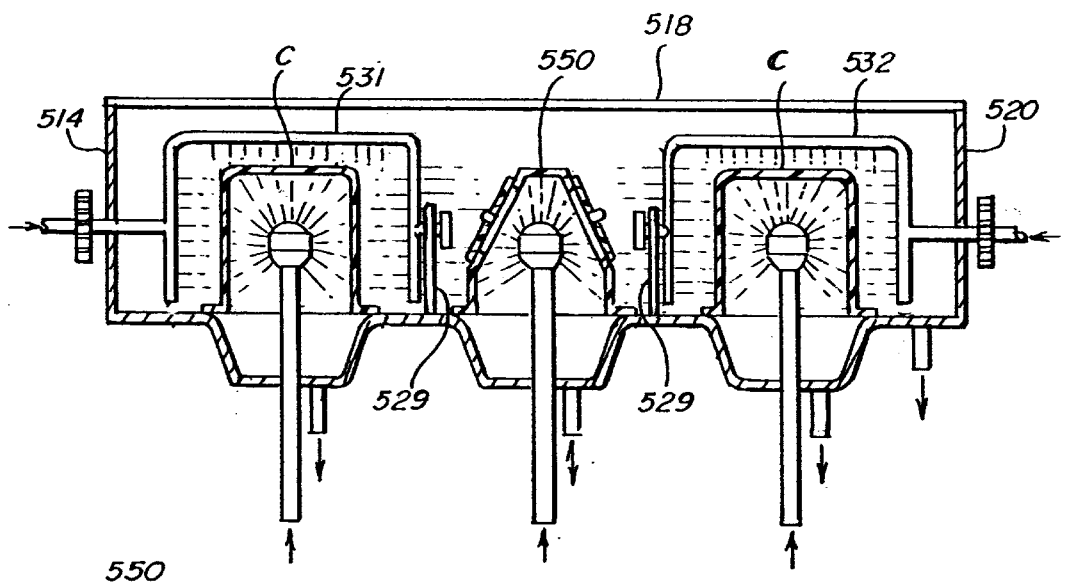
FIG. 12B is a cross-sectional front view of FIG. 12A.

Referring to FIGS. 12A and 12B, wafer carrier cleaner 500 comprises a chamber 512 which has a first sidewall 514, a rear wall 518, a second sidewall 520, a base 524, fluid supply aperture 525 and an automatic controller AC. The first sidewall 514 has an aperture 516 which is sized to receive one end of a first u-shaped exterior sprayer 531, and the second sidewall 520 has a aperture 522 which is sized to receive one end of a second u-shaped exterior sprayer 532. The other ends of first and second sprayers 531, 532 are rotatably supported by stanchions 529 which project upwardly from the base of the chamber 512. The innermost leg of the first and second sprayers are capable of applying fluids to the exterior surfaces of wafer carriers C and to the exterior surfaces of centrally positioned door panels P attached to fixture 550 (i.e., in opposing directions). The independently controllable sprayers 531, 532 allow cleaning and washing to be tailored according to need. For example, the time required to prepare a relatively clean carrier and door placed in the left side of the chamber 512 may be less than the time required to prepare a relatively dirtier carrier and door in the right side of the chamber 512. Wafer carriers C may be removably secured to the base portion 524 by securement members 527 which rotate into and out of engagement with carriers C.

Figure 15:
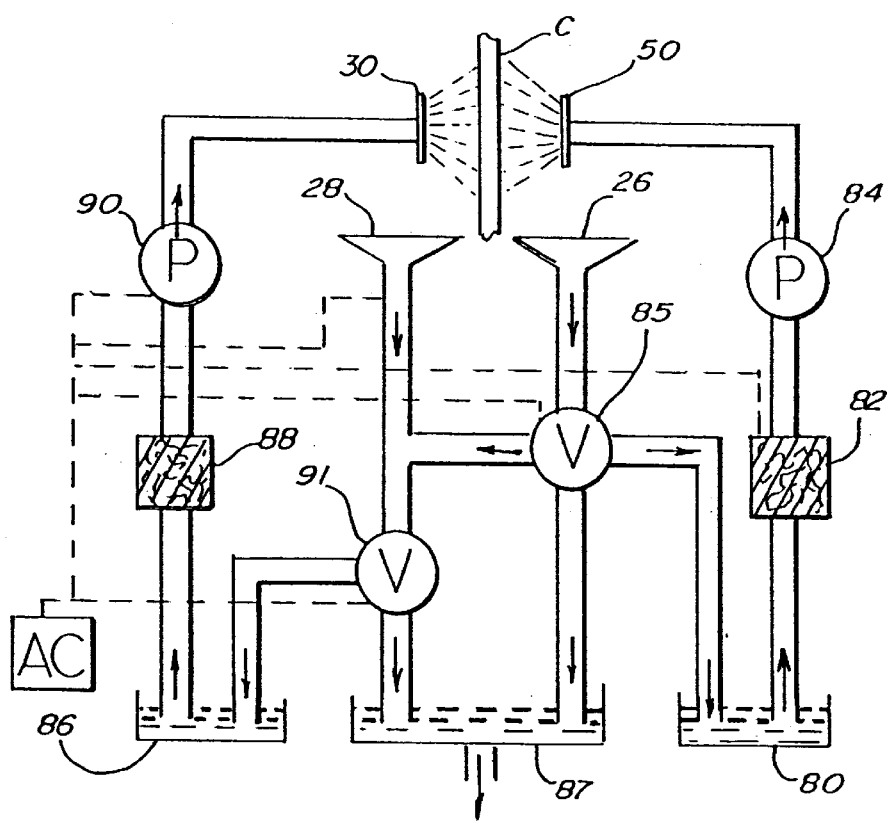
FIG. 15 is a schematic view of the invention.

Action of the wafer carrier washer 500 is preferably automated using an appropriately configured computer control AC which is in communication with the drive mechanisms for the sprayers (not shown) and with the valves, pumps, and filter elements of the fluidic circuits (see FIG. 15). Such automatic control is conventional and well known to those knowledgeable in the art and therefore will not be further detailed. For example, see U.S. Pat. No. 5,616,208, which shows a computerized control unit. Said patent is hereby incorporated herein by reference.

Figure 13A:
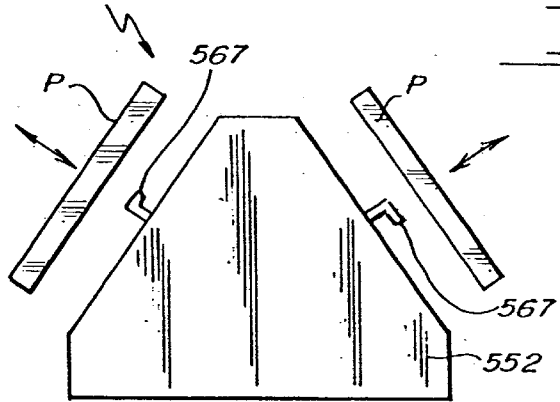
FIG. 13A is a side view of the center section as shown in FIG. 12.
Figure 13B:
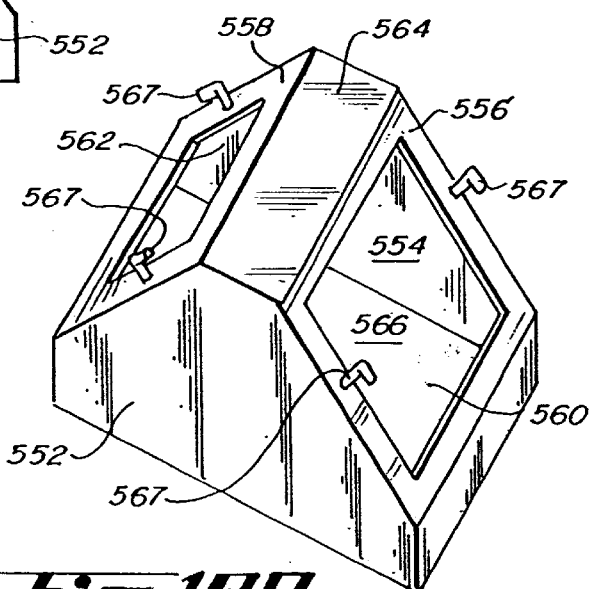
FIG. 13B is a perspective view of the center section as shown in FIG. 12.

Referring to FIGS. 13A, 13B, the door cleaning adaptor 550 includes a frame is generally triangular in shape and includes first and second edges 552, 554 and first and second sides 556, 558 which include apertures 560, 562 which are sized to releasably retain wafer carrier doors P. Alternatively, doors P may be releasably retained to the adaptor 550 by securement members 567 which rotate into and out of engagement with the doors P. The adaptor 550 includes a top wall 564, and a bottom with an aperture 566. Aperture 566 is sized to allow interior cleaning fluid in the space defined by the cleaning adaptor and wafer carrier doors.

With regard to FIGS. 9–13, it is understood that the adaptor may be constructed to enable more than two doors or panels to be cleaned. For example, the bracket or frame or fixture could be cubic to enable three, four, or five doors to be cleaned, or it could be pentagonal or hexagonal to enable other combinations of doors to be cleaned. Additionally, although the bracket or frame or fixture is depicted as between two wafer carriers, it is understood that it may be positioned to either side of the chamber.

Figure 14:
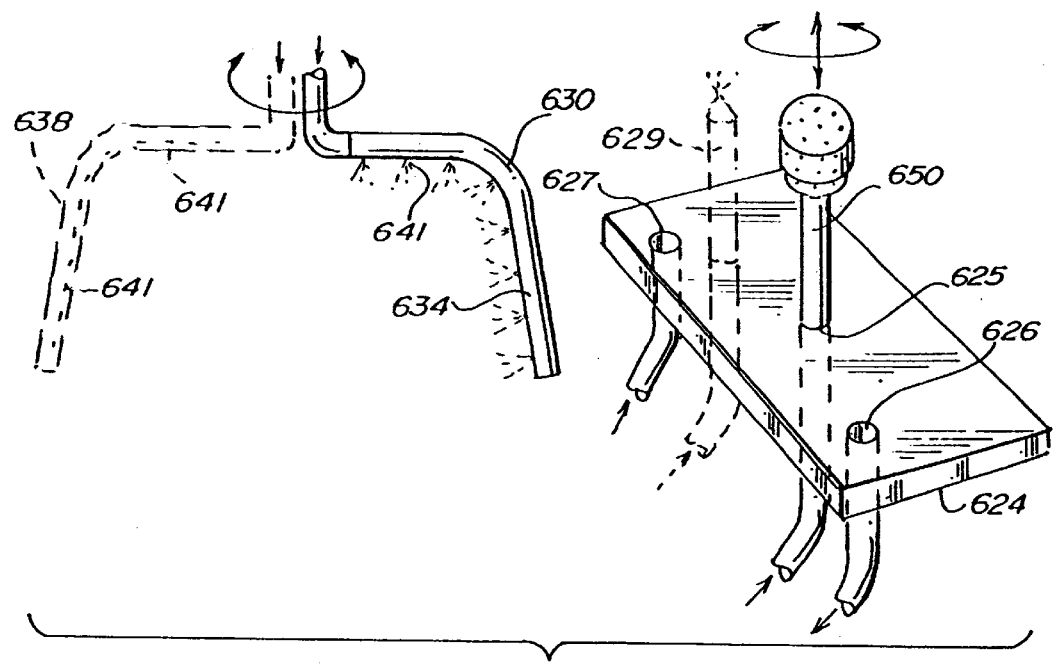
FIG. 14 is a perspective view of an alternate embodiment of the invention.

Referring to FIG. 14, the base 624 is configured to be removably retained by a wafer carrier and is similar in shape to a door (not shown). Comparing with FIG. 2, the base 626 includes an additional aperture 625 which receives interior sprayer 650. The aperture 625 is sized to effectively seal the interior sprayer 650 to the base 624. The aperture 625 may be provided with a seal such as an O-ring to enable the interior sprayer to be moved or rotated relative to the base 624. The interior cleaning fluid is directed to aperture 626 as shown in FIG. 2. The base 626 includes an additional aperture 627 through which pressurized fluid is supplied, thus creating a positive pressure differential within the space defined by the wafer carrier (not shown) and the base 624. Although a series of cleaning fluids may be applied through interior sprayer 650, it may be desirable to keep some or all of the cleaning fluids separate. To that end, an additional sprayer 629 (shown in dashed lines) may be added. Additional sprayers may be provided to the extent that none of the different cleaning fluids come into contact with each other, thus reducing cross contamination.

The exterior sprayer 630 comprises one leg 634 with at least one aperture 641 and which is arcuate in shape. The exterior sprayer is rotatably mounted such that the sprayer leg 634 circumscribes the exterior of a wafer carrier as the sprayer is rotated. Although a series of cleaning fluids may be applied through leg 634, it may be desirable to keep some or all of the cleaning fluids separate. To that end, additional legs may be provided. An additional leg 638 (shown in dashed lines) as depicted is similar to leg 634 but includes at least one air knife. With a two leg arrangement, both of the legs 634, 638 are rotatably mounted such that they circumscribe the exterior of a wafer carrier. Additional legs may be provided to the extent that none of the different cleaning fluids come into contact with each other, thus eliminating cross contamination. Drainage may also be dedicated to individual fluids by providing diverters or valves which are opened or closed as each fluid is applied to a wafer carrier.

If the interior of a wafer carrier is not in need of cleaning, a false door similar to the base 624 of FIG. 14 may be utilized to prevent contamination while the exterior of a wafer carrier is being cleaned. The difference between the two is that the false door would not have any apertures therethrough.

Referring to FIG. 15, the exterior fluid sprayer 30 is on one side of wafer carrier C and the interior fluid sprayer 50 is on the other side of wafer carrier C. As fluid is sprayed from the exterior sprayer 30 it flows into aperture 28 of the base. From there it may be directed by valve 91 to a receptacle 86 or a common receptacle 87. Receptacle 86 enables the exterior cleaning fluid to be recycled for reuse. As the exterior fluid is recycled, it may pass through filter 88 which may be provided with particulate detectors (not shown) and through pump 90.

As fluid is sprayed from the interior sprayer 50, it flows into aperture 26 of the base. From there it may be directed by valve 85 to receptacle 80, receptacle 86, or common receptacle 87. If the interior fluid is to be recycled, it is directed towards receptacle 80. From there it may pass through filter 82 which may be provided with particulate detectors (not shown) and through pump 84. As an alternative, the interior cleaning fluid may be directed towards the exterior fluid receptacle where the useful life may be extended. In the third option, the interior cleaning fluid is directed towards a common receptacle 87 for further treatment or disposal. Although the circulation system in FIG. 15 is depicted for a single fluid such as rinse water, it is understood that each fluid could be provided with a similar arrangement.

Figure 16:
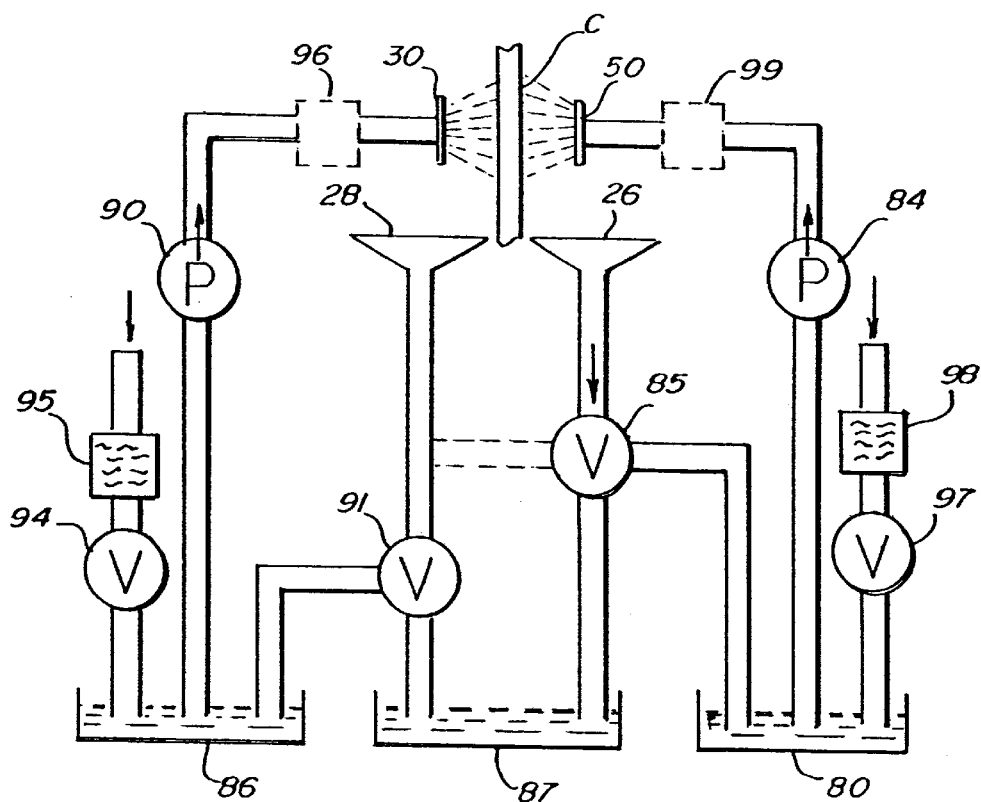
FIG. 16 is an alternate schematic view of the invention.

Referring to FIG. 16, the exterior fluid sprayer 30 is on one side of wafer carrier C and the interior fluid sprayer 50 is on the other side of wafer carrier C. As fluid is sprayed from the exterior sprayer 30 it flows into aperture 28 of the base. From there it may be directed by valve 91 to a receptacle 86 or a common receptacle 87. Receptacle 86 enables the exterior cleaning fluid to be recycled for reuse. The exterior fluid is passed through pump 90, and may pass through optional filter 96 which may be provided with particulate detectors (not shown). Additional cleaning fluid may be added to the system through a supply line equipped with a filter 95 and a valve 94. The valve may be metering valve which enables a precise amount of fluid to be added to the system.

As fluid is sprayed from the interior sprayer 50, it flows into aperture 26 of the base. From there it may be directed by valve 85 to receptacle 80, receptacle 86, or common receptacle 87. If the interior fluid is to be recycled, it is directed towards receptacle 80. From there it passes through pump 84 and may pass through filter 99 which may be provided with particulate detectors (not shown). As an alternative, the interior cleaning fluid may be directed towards the exterior fluid receptacle where the useful life may be extended. In the third option, the interior cleaning fluid is directed towards a common receptacle 87 for further treatment or disposal. Although the circulation system in FIG. 16 is depicted for a single fluid such as rinse water, it is understood that each fluid could be provided with a similar arrangement.

Additional cleaning fluid may be added to the system through a supply line equipped with a filter 98 and a valve 97. The valve may be metering valve which enable a precise amount of fluid to be added to the system. Since the operation of the exterior cleaning fluid side is essentially the same as the operation of the interior cleaning fluid side, only the exterior cleaning side will be described. Valve 94 opens and admits a predetermined amount of cleaning fluid, for example filtered, deionized, heated water, into the circuit. Pump 90 is then actuated which in turn activates exterior sprayer 30. Cleaning fluid is collected in aperture 28 and may be directed back to receptacle 86 or common receptacle 87. When the cleaning fluid is directed to the common receptacle, a new charge of cleaning fluid is admitted into the system.

In general, chambers 12, 112, 200, 400, and 500 may be provided with a cover (for example, shown in dashed lines in FIG. 1 as A) which covers the top and front of the chamber during the cleaning process and effectively seal the chambers. The inclusion of covers enables the chambers to operate in conditions which are not ultra-clean. To further reduce cross contamination, a positive pressure differential may be created between the interior and exterior of a wafer carrier to be cleaned. And, to further reduce cross contamination, a positive pressure differential may also be created between the chamber and the environment. Thus, extraneous contaminants are preferably directed from a relatively cleaner environment to a relatively dirtier environment. The pressure differentials may be created by use of positive pressure, negative pressure or a combination of positive and negative pressures.

Additionally, the base portion of chambers 12, 112, 200, 400, and 500 may be provided with an appropriately configured sealing element which may be placed at the interface of the base portion and the wafer carrier to further effectively prevent cross contamination between the fluidic circuits.

Figures 17A, 17B, 17C:
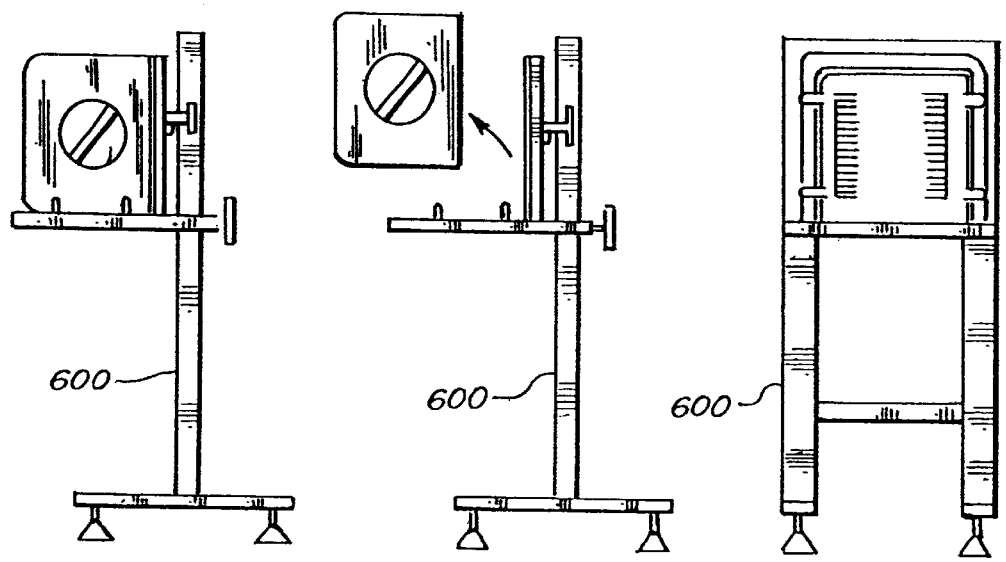
FIG. 17A, 17B and 17C are side and front elevations showing a door unlocking station used in conjunction with the wafer carrier cleaner.

The method of use will now be briefly discussed. A wafer carrier which is to be cleaned is brought to the chamber area. If the wafer carrier has a panel or door, it is removed and preferably attached to a door cleaning adaptor 600 (see FIGS. 17A, 17B and 17C) that is preferably located adjacent to the wafer cleaner carrier 10. The wafer carrier is then positioned within a chamber such that it covers the second or interior sprayer. The cover to the chamber is then closed to effectively seal the chamber, at which time the cleaning cycle is initiated. Separate cleaning fluids, which may be liquid and or gaseous in nature, and which may be heated or cooled, are then applied to the interior and exterior surfaces. After the cleaning cycle is completed, the wafer carrier and panel are preferably dried with gaseous fluids such as NO2 and which may be heated to reduce drying time. If desired, interior gaseous fluids may be directed to the exterior surface to assist in drying. After the drying cycle is complete, the wafer carrier and panel are removed and reassembled. It should be understood that movement, transfer, and the opening and closing of the carrier may be accomplished manually or by automated means.

Figure 18:
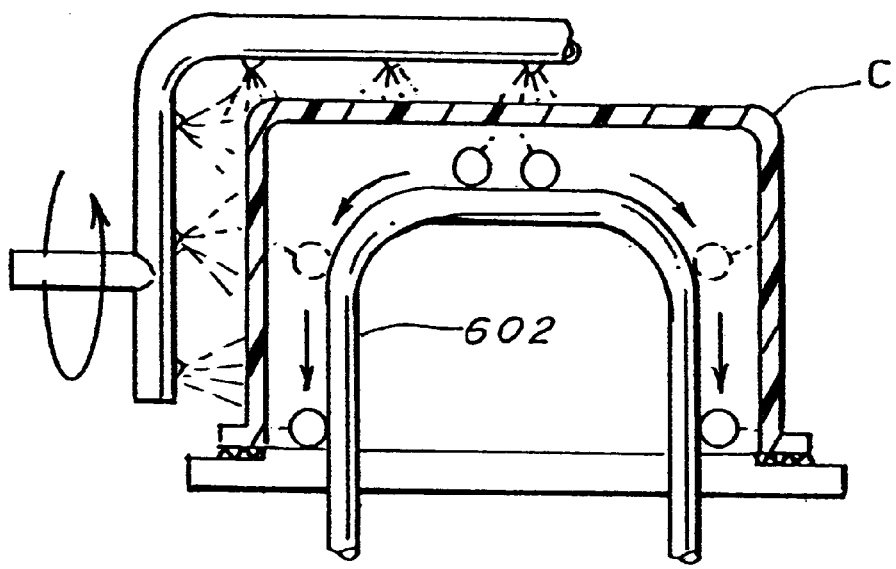
FIG. 18 is across sectional front view of a single wafer carrier cleaning station.
Figure 19:
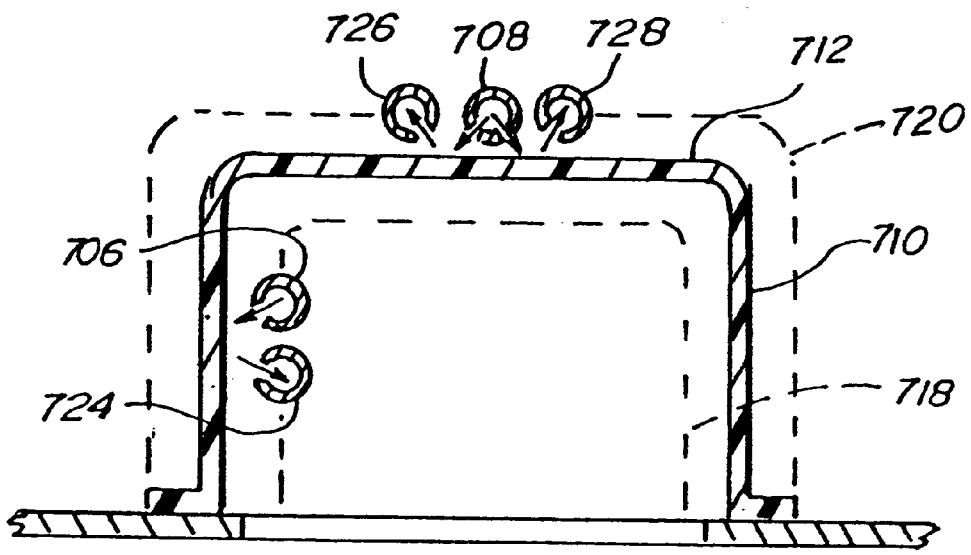
FIG. 19 is a sectional side view showing an alternative drying arrangement.

As an alternative to drying the interior surface of a wafer carrier or pod by a moving sprayer, the interior surface may be dried by providing a block or mandrel 602 (FIG. 18) which is sized to occupy a substantial amount of space defined by the wafer carrier or pod C, as most clearly illustrated in FIG. 19. A drying fluid would then be introduced along a portion of the open space defined by the wafer carrier or pod and the block. Because the block is sized to substantially occupy the space defined by a wafer carrier or pod, the drying fluid would be constrained to move within the open space defined by the block and the wafer carrier. Thus, the drying fluid can obtain relatively high velocities, whereby drying time is reduced. Both the drying fluid and the block or mandrel may be heated to further reduce the amount of drying time.

The mandrel or block may also be combined with moveable sprayers wherein the sprayers follow the contour of the mandrel instead of the tracks as discussed above.

Referring to FIG. 19, an alternative drying arrangement is shown. Drying gas discharge members 706, 708 travel along the interior 710 or exterior surface 712 along the pathways 718, 720 designated by dashed lines. In conjunction therewith one or more moisture collection members 724, 726, 728 having a negative pressure travel with the drying gas discharge members to efficiently collect the discharged drying gas and moisture, particulates and/or other debris which may be on the surfaces or features of the pod C. The suction of the drying gas and moisture accelerates the drying process as droplets are not merely blown off the surfaces for possible redeposition but are generally collected. The dry gas discharge members and collection members may be suitably configured and operated as shown in the single sprayer in FIGS. 1 and 2A or the other multiple sprayer configurations as shown. Additionally, these members may be suitably track mounted as illustrated in FIGS. 2E and 2D.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A method of cleaning a wafer carrier having an interior surface and an exterior surface, the method comprising the steps of:

providing a base portion having a first aperture and a second aperture;

connecting the first aperture to a first fluidic circuit;

connecting the second aperture to a second fluidic circuit;

placing a wafer carrier in sealing contact about the first aperture, thereby forming a seal between said first and second fluidic circuits;

circulating fluid between the first aperture and the interior surface of the wafer carrier to remove contaminants thereon;

recycling at least a portion of the fluid from the first fluidic circuit to the second fluidic circuit; and circulating fluid between the second aperture and the exterior surface of the wafer carrier to remove contaminants thereon, wherein none of the fluid from the second fluidic circuit is recycled into the first fluidic circuit.

2. The method of cleaning of claim 1, wherein the step of circulating fluid between the first aperture and the interior surface of the wafer carrier to remove contaminants thereon comprises the steps of:

providing the first fluidic circuit with a first fluid applicator; and directing fluid exiting the first fluid applicator along a first predetermined path; and the step of circulating fluid between the second aperture and the exterior surface of the wafer carrier to remove contaminants thereon comprises the steps of:

providing the second fluidic circuit with a second fluid applicator; and directing fluid exiting the second fluid applicator along a second predetermined path.

3. A method of cleaning a wafer carrier door having an interior surface and an exterior surface, the method comprising the steps of:

providing a base portion having a first aperture and a second aperture;

connecting the first aperture to a first fluidic circuit;

connecting the second aperture to a second fluidic circuit;

placing a wafer carrier door in sealing contact with a wafer carrier door holding fixture;

placing the wafer carrier door holding fixture in sealing contact about the first aperture;

circulating fluid between the first aperture and the interior surface of the wafer carrier door to remove contaminants thereon;

feeding at least a portion of the fluid from the first fluidic circuit into the second fluidic circuit; and circulating fluid between the second aperture and the exterior surface of the wafer carrier door to remove contaminants thereon, wherein none of the fluid from the second fluidic circuit is fed into the first fluidic circuit.

4. The method of cleaning of claim 3, wherein the step of circulating fluid between the first aperture and the interior surface of a wafer carrier door to remove contaminants thereon comprises the steps of:

providing the first fluidic circuit with a first fluid applicator; and directing fluid exiting the first fluid applicator along a first predetermined path; and the step of circulating fluid between the second aperture and the exterior surface of a wafer carrier door to remove contaminants thereon comprises the steps of:

providing the second fluidic circuit with a second fluid applicator; and directing fluid exiting the second fluid applicator along a second predetermined path.

5. A method of cleaning a wafer carrier having an interior surface and an exterior surface, the method comprising the steps of:

providing a base portion having a first aperture and a second aperture;

connecting the first aperture to a first fluidic circuit having a first spray applicator portion;

connecting the second aperture to a second fluidic circuit having a second spray applicator portion;

placing a wafer carrier in sealing contact about the first aperture to thereby form a seal between said first and second fluidic circuits;

circulating fluid between the first aperture, the first spray applicator portion and the interior surface of the wafer carrier to remove contaminants thereon; and circulating fluid between the second aperture, the second spray applicator and the exterior surface of the wafer carrier to remove contaminants thereon.

6. The method of claim 5, wherein the step of circulating fluid between the first aperture, the first spray applicator portion and the interior surface of the wafer carrier to remove contaminants thereon further comprises the step of:

directing fluid exiting the first spray applicator portion along a first predetermined path; and the step of circulating fluid between the second aperture, the second spray applicator portion and the exterior surface of the wafer carrier to remove contaminants thereon further comprises the step of:

directing the fluid exiting the second spray applicator portion along a second predetermined path.

7. A method of cleaning a wafer carrier having an interior surface and an exterior surface, the method comprising the steps of:

insertion of the wafer carrier into a fluid tight chamber so that the interior surface is isolated from the exterior surface;

directing a first circulating cleaning fluid to the interior surface;

directing a second circulating cleaning fluid to the exterior surface; and mixing at least a portion of the first circulating cleaning fluid with the second circulating cleaning fluid, wherein none of the second circulating cleaning fluid is mixed into the first circulating cleaning fluid.

* * * * *